United States Patent [19]
Van Voorhis

[11] 3,984,833
[45] Oct. 5, 1976

[54] APPARATUS FOR ENCODING EXTENDED RUN-LENGTH CODES

[75] Inventor: David Curtis Van Voorhis, Los Gatos, Calif.

[73] Assignee: International Business Machines Corporation, Armonk, N.Y.

[22] Filed: July 17, 1975

[21] Appl. No.: 596,696

Related U.S. Application Data

[62] Division of Ser. No. 428,500, Dec. 26, 1973, Pat. No. 3,925,780.

[52] U.S. Cl. .......................................... 340/347 DD
[51] Int. Cl.² ...................................... H03K 13/24
[58] Field of Search ............... 340/347 DD, 172.5; 178/DIG. 3, DIG. 6

[56] References Cited
OTHER PUBLICATIONS

Atrubin, "IBM Technical Disclosure Bulletin," vol. 14, No. 3, Aug. 1971, pp. 874–876.

Primary Examiner—Charles D. Miller
Attorney, Agent, or Firm—Owen L. Lamb

[57] ABSTRACT

Apparatus for encoding ordinary run-length codes and run-length codes that have been extended to include two classes of code words, regular code words for runs and special code words for selected special situations. The encoder comprises table storage, select/combine circuitry, and shift-out circuitry. The table storage holds four small tables whose values can be adjusted to correspond to any ordinary or extended run-length code to be implemented. The select/combine circuitry accepts as input a binary value that uniquely identifies the desired code word, and combines this binary value with selected table values to calculate the desired code word. The code word bits are then outputted sequentially by the shift-out circuitry.

4 Claims, 8 Drawing Figures

APPARATUS FOR ENCODING EXTENDED RUN-LENGTH CODES

CROSS-REFERENCE TO RELATED APPLICATIONS

This application is a divisional of application Ser. No. 428,500, filed 12/26/73 now U.S. Pat. No. 3,925,780 in the name of D. C. VanVoorhis, and assigned to IBM Corporation.

BACKGROUND OF THE INVENTION

The invention relates to data compression techniques for digital images, and more particularly, to an apparatus for encoding the ordinary and extended run-length codes required by such techniques.

A digital image is a two-dimensional array of image points, each of which represents the light intensity of a small area of a physical picture. For black/white images, each image point is a single bit of information with a value of either 0 or 1 to indicate, respectively, that the corresponding area of the picture is light or dark. These images are normally generated by scanning pictorial data, such as 8 ½ × 11 inches documents. Thereafter, the scanned pictorial data can be stored, viewed from a display, transmitted, or printed.

A variety of data compression techniques have been devised for reducing the storage requirements for digital images, and for reducing the bandwidth required for their transmission. Most of these techniques are based on some form of run-length coding.

In its simplest form, run-length coding of images involves two steps. First, there is the partitioning of each row of the image array into a sequence of runs, with each run comprising one or more adjacent image points with the same binary value, i.e., 0 or 1. Second, it is necessary to replace each run of image points with a single integer that specifies the length of the run. For example, a run of 10 successive image points with the value of 0 can be replaced by the single integer 10. It is not necessary to identify explicitly the binary value of each run. It is sufficient to specify the binary value of the first run in each row, since the binary values of successive runs alternate between 0 and 1.

More efficient run-length coding techniques use a variable-length binary code word, rather than integers, to represent the lengths of the various runs. The run-length codes used with such techniques are designed so that the shorter code words are used to represent more frequently occurring runs and the longer code words are used for less frequently occurring runs. For typical applications the runs of lengths 1 to 5 occur most frequently, and the probability of occurrence for successively longer runs tends to increase steadily thereafter. There is one single exception, that is the longest possible run. Such a run can, for example, result from an all-white line on a printed page, which occurs frequently. Since the probability of occurrence of a run tends to decrease with the length of the run, the length of the code word used to represent a run generally increases with the length of the run. For example, a run of length 20 is normally represented by a code word that is longer than the code word used for a run of length 10.

A slightly different group of run-length coding techniques have been used when the number of image points with a binary value of 0 far exceeds the number of image points with a binary value of 1. These techniques partition each row of the image array into a number of runs of 0's, each separated by a single 1. Then, only the runs of 0's are encoded. Although it is sometimes necessary to encode the run of no 0's that appears between two adjacent 1's in a row of the image array, it is not necessary to encode any runs of 1's. This strategy is particularly effective when used in conjunction with predictive encoding, which transforms an original image array into a new array that includes few 1's. See, for example, L. Bahl et al., U.S. Pat. No. 3,769,453, "Finite Memory Adaptive Predictor."

Finally, a few sophisticated data compression techniques for images use run-length codes that have been extended to include a number of special code words in order to represent certain special situation. These special code words are an addition to the regular code words used to represent runs. An example is the code described by I. Gorog et al in the article entitled An Experimental Low Cost Graphic Information Distribution Terminal, 1971 SID International Symposium of Technical Papers. Gorog's code includes three special code words for special situations. These special situations are the occasion that a run in one row of an image array either ends directly beneath the end point of a corresponding run in the previous row, or ends one position to the left or right of this end point.

The primary disadvantage of previous run-length coding systems is that they have used an ordinary or extended run-length code which represented a compromise along three coding objectives. The objectives are high efficiency for typical images, uniformly high efficiency for a class of images, and an economical implementation. In this regard, reference should be made to N. Abramson, "Information Theory and Coding," McGraw Hill Book Co., New York, 1963 at pp. 85–88 for a discussion for code efficiency. Abramson's efficiency measure is based upon the value of a symbol from an information source $S$, which can be measured in terms of an equivalent number of binary digits needed to represent one symbol from that source. The average value of a symbol from S is denoted by $H(S)$. Note that $$H(S) = - \sum_i p_i \log_2 p_i ,$$

where $p_i$ is the probability of the $i$th source symbol. Given that $l$ is the average code word length for any uniquely decodable code for the source, it is the case that $l$ cannot be less than $H(S)$. Accordingly, the efficiency of the code is the ratio of $H(S)/l$.

Taking the above coding objectives into account, the most easily implemented run-length code, which uses the fixed-length binary integer $i$ as a code word for runs of length $i$, is not nearly as efficient as a variable-length code. On the other hand, the most efficient extended run-length code possible for a sample of images is the Huffman code based on the relative frequencies of runs and special situations in a sample of images. However, since run-length codes for images typically require 1,000 to 5,000 code words, the Huffman code is normally difficult to implement.

A second disadvantage of most previous run-length coding systems is their inflexibility — they are only able to implement a single code specifically designed for a particular data compression technique and a particular class of images. Although a few previous systems can be adjusted to implement the new code required for a new data compression technique or a new class of images, these systems must use an amount of table storage that is proportional to the number of code words. Since ordinary and extended run-length codes require 1,000 to 5,000 code words, this table storage is quite large, and hence is expensive.

A third disadvantage of most previous run-length coding systems is their awkward treatment of the special code words required by extended run-length codes. In most cases these special code words have necessitated a great deal of special circuitry.

A fourth disadvantage of most previous run-length coding systems is that the encoder serves both to identify the lengths of successive runs and to generate the code words appropriate for these lengths. Such encoders must generate, for each bit of a run received, the code word that would be appropriate if the run should end with this bit. This generation of unnecessary code words is quite time-consuming.

SUMMARY OF THE INVENTION

It is therefore an object of this invention to provide an economical apparatus for encoding ordinary and extended run-length codes that are both highly efficient for a sample of images and uniformly efficient for a class of images.

It is a further object of this invention to provide an apparatus that can be simply and inexpensively adapted for encoding a variety of different ordinary and extended run-length codes.

It is yet another object of this invention to provide an encoding apparatus that does not require special circuitry for the encoding of the special code words.

It is yet another object of this invention to provide an encoding apparatus that can generate the code word appropriate for a run of one length without first having to generate the code words appropriate for all shorter runs.

The above and other objects are accomplished in accordance with the invention by apparatus comprising table storage, select/combine circuitry, and shift-out circuitry. The table storage is sufficient to hold four small tables whose values can be adjusted to correspond to any ordinary or extended run-length code to be implemented. The select/combine circuitry accepts as input a binary value consisting of a one-bit integer $s$ that indicates whether a regular or special code word is desired and a multi-bit integer $i$ that identifies the desired regular or special code word. The integer $i$ is compared with successive elements of one stored table until a value as large as $i$ is found, and then this and another selected table element are combined with $i$ to calculate an integer whose leftmost bits comprise the desired code word. The bits of this code word are then outputted sequentially by the shift-out circuitry.

More particularly, the disclosed apparatus comprises an encoder that can calculate and output code words for a specific class of ordinary and extended run-length codes. As will be shown, this class of codes includes a code of uniformly high efficiency for any desired data compression technique and any desired class of images.

The class of codes to be implemented includes the ordinary and extend run-length codes characterized by three parameters, a maximum number N of regular code words, a maximum number M of special code words, and a maximum code word length $l_{max}$.

The class of codes to be implemented is further restricted by the requirements that the code word lengths $l_r(1), l_r(2), \ldots$ for the regular code words $c_r(1), c_r(2), \ldots$ must be monotonically increasing. The code word lengths $l_s(1), l_s(2), \ldots$ for the various special code words $c_s(1), c_s(2), \ldots$ must also be monotonically increasing. That is, the code word lengths must satisfy the relations $$l \leq l_r(1) \leq l_r(2) \leq \ldots \leq l_{max}$$

$$l \leq l_s(1) \leq l_s(2) \leq \ldots \leq l_{max}$$

Finally, the code words for the codes to be implemented must be related algebraically to the elements of four small tables, $BR = <b_r(1), b_r(2), \ldots, b_r(l_{max})>$, $BS = <b_s(1), b_s(2), \ldots, b_s(l_{max})>$, $TR = <t_r(1), t_r(2), \ldots, t_r(l_{max})>$, and $TS = <t_s(1), t_s(2), \ldots, t_s(l_{max})>$, whose values are determined by the code word lengths according to the formulas $b_r(k)$ = number of regular code words with length $k$ or less;

$b_s(k)$ = number of special code words with length $k$ or less;

$$t_r(k) = \sum_{i=1}^{b_r(k)} 2^{k-l_r(i)} + \sum_{j=1}^{b_s(k-1)} 2^{k-l_s(j)}$$

$$t_s(k) = \sum_{i=1}^{b_r(k)} 2^{k-l_r(i)} + \sum_{j=1}^{b_s(k)} 2^{k-l_s(j)}$$

In particular, the regular and special code words for codes to be implemented must be the binary integers related to these table values according to the formulas $$c_r(i) = t_r(l_r(i)) - b_r(l_r(i)) + i - l;$$

$$c_s(j) = t_s(l_s(j)) - b_s(l_s(j)) + j - l.$$

These relationships between the monotonically increasing code word lengths, the table values, and the code words themselves are illustrated in Tables 1 and 2 for a code which includes seven regular code words and two special code words.

TABLE 1

| | SAMPLE CODE | | | |
|---|---|---|---|---|
| i | $l_r(i)$ | $l_s(i)$ | $c_r(i)$ | $c_s(i)$ |
| 1 | 2 | 2 | 00 | 01 |
| 2 | 3 | 3 | 100 | 101 |
| 3 | 4 | — | 1100 | — |
| 4 | 4 | — | 1101 | — |
| 5 | 4 | — | 1110 | — |
| 6 | 5 | — | 11110 | — |
| 7 | 5 | — | 11111 | — |

TABLE 2

| | TABLE VALUES FOR SAMPLE CODES | | | |
|---|---|---|---|---|
| k | $b_r(k)$ | $b_s(k)$ | $t_r(k)$ | $t_s(k)$ |
| 1 | 0 | 0 | 0 | 0 |
| 2 | 1 | 1 | 1 | 2 |
| 3 | 2 | 2 | 5 | 6 |
| 4 | 5 | 2 | 15 | 15 |
| 5 | 7 | 2 | 32 | 32 |

A simple example will serve to illustrate that the class of ordinary and extended run-length codes implemented by the disclosed encoder includes a code with uniformly high efficiency for any desired data compression technique and any desired class of images.

Suppose that the desired compression technique requires an extended run-length code with code words for runs of lengths $l$ through $n$, and with code words for $m$ special situations. Then, the relative frequencies of occurrence for the various runs and special situations may be measured in a sample of images, and these relative frequecies may be used to separate the runs and special situations into two ordered lists of events. In particular, the successive regular events are the runs with lengths $f$ through $n-1$, where $f$ is the length of the most frequently occurring run. The successive special events are the $m$ special situations plus the runs with lengths $l$ through $f-1$ and the runs of length $n$, all taken in order of decreasing frequency of occurrence. The relative frequencies of the $n-f$ regular events and the $m+f$ special events are used to calculate code word lengths that are ordered and bounded according to the two relations $$l \leq l_r(1) \leq l_r(2) \leq \ldots \leq l_r(n-f) \leq l_{max},$$

$$l \leq l_s(1) \leq l_s(2) \leq \ldots \leq l_s(m+f) \leq l_{max},$$

and that lead to the minimum average code word length permitted by these relations. Finally, the code word lengths are used in these previously provided formulas to calculate values for the BR, BS, TR, and TS tables, and hence to calculate the $n-f$ regular code words $c_r(1), c_r(2), \ldots, c_r(n-f)$ and the $m+f$ special codes words $c_s(1), c_s(2), \ldots, c_s(m+f)$.

The simple code construction technique just described constructs an extended run-length code whose code word lengths are both monotonically increasing and bounded. As will be shown, this code is normally both highly efficient for the sample images and uniformly efficient for similar images not in the sample. For typical data compression techniques the relative frequencies for runs reaches its maximum value for runs of length $f$, where $f$ is less than 5, and then the relative frequencies for successively longer runs tend to decrease for runs with lengths between $f$ and $n-1$. Therefore, the above code construction technique places the regular events approximately in order of descreasing relative frequency, and it places the special events exactly in order of decreasing relative frequency, so that monotonically increasing code word lengths lead to a code that is highly efficient for the sample images. Furthermore, E. N. Gilbert shows in his article "Codes Based on Inaccurate Source Probabilities," *IEEE Transactions on Information Theory*, Vol. IT-17, pp. 304–314, May 1971, that using a bound $l_{max} \geq \log_2(n+m)$ for the length of the longest codewords tends to promote uniformly high code efficiency.

In summary, the invention contemplates a method and an apparatus for encoding event designations into code words from an ordinary or extended run-length code. In this regard, an event designation is understood to comprise a one-bit integer $s$ that indicates whether a regular or a special code word is desired, and a multi-bit integer $i$ that identifies the desired regular or special code word. That is, if $s = 0$ then the $i$th regular code word $c_r(i)$ is designated, whereas if $s = 1$ then the $i$th special code word $c_s(i)$ is designated.

The apparatus comprises storage for four tables, a BR table, a BS table, a TR table, and a TS table. The table values can be adjusted to correspond to any ordinary or extended run-length code to be implemented.

The apparatus further comprises select/combine circuitry. The select portion of the select/combine circuitry includes: means for accepting as input an event designation $s,i$; means for comparing $i$ with successive elements of the BR table if $s = 0$, or with successive elements of the BS table if $s = 1$, until an element $b_r(k)$ or $b_s(k)$ of the appropriate table is found that is at least as large as $i$; and means for selecting a corresponding element $t_r(k)$ from the TR table if $s = 0$ or a corresponding element $t_s(k)$ from the TS table if $s = 1$. The combine portion of the select/combine circuitry includes means for combining $i$ with the selected table elements to calculate the $l_{max}$-bit binary integer C according to the relation $$C = 2^{l_{max} - k} [t_r(i) - b_r(k) + i - l], \text{ if } s = 0,$$

$$C = 2^{l_{max} - k} [t_s(k) - b_s(k) + i - l], \text{ if } s = 1.$$

The leftmost $k$ bits of $C$ constitute either the desired regular code word $c_r(i) = t_r(k) - b_r(k) + i - l$ if $s = 0$, or the desired special code word $c_s(i) = t_s(k) - b_s(k) + i - 1$, if $s = 1$.

Finally, the apparatus additionally comprises shift-out circuitry for outputting sequentially the successive bits of the regular code word $c_r(i)$, if $s = 0$, or the successive bits of the special code word $c_s(i)$, if $s = 1$.

DESCRIPTION

The data compression encoding circuitry of the present invention may be implemented in various preferred forms and arrangements. One such embodiment is illustrated by the encoding arrangement of FIG. 1.

Figure 1:
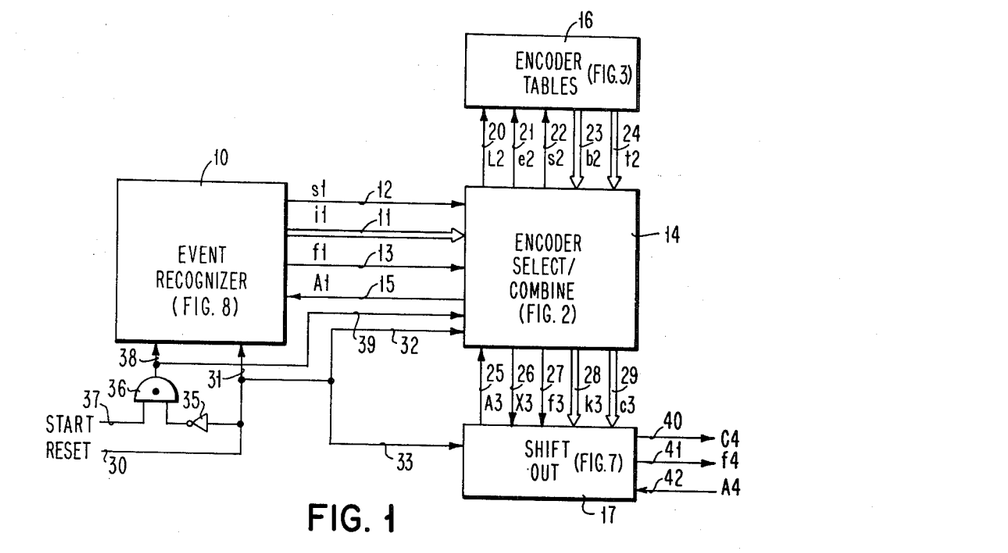
FIG. 1 is a generalized block diagram of a data compression encoding apparatus in accordance with the present invention.

FIG. 1 includes an event recognizer 10. The present invention relates to the encoding of information, wherein elements of information may be characterized as events. An information element, or event, may comprise a binary encoded representation of an alphanumeric character, an analog voltage, a run of binary video information, a run of binary image information, or any other type of information capable of recognition. The events may be further characterized as regular or special.

The event recognizer 10 is designed to recognize each element of the specific type of information which is presented to it and to supply a binary output therefrom characterizing each received unit of information. The event characterization comprises a single bit of information to indicate whether the event is regular or special, and an event designation number that uniquely identifies the event.

Although the present invention can be employed in a wide variety of information environments, including those in which no events are classified as special, it is currently anticipated that the most advantageous usage of the present invention will be in the field of run length encoding. In such a circumstance, the event recognizer 10 may recognize each sequence of consecutive bits of the same logic level, which is denoted as a run. Runs may also be sequences of bits of one of the logic levels, or sequences of a level terminating in another level. All runs can be classified as regular events, and the event designation number for a run can simply be the length of that run. Alternatively, runs of certain lengths can be classified as special events. For example, runs of length 1 or 2 can be classified as special events and characterized by event designation numbers 1 or 2, while the remaining runs can be classified as regular events, with the event designation number for a run of length 3 or greater simply two less than the length of that run. Thus, a run of length 4 would be characterized by event recognizer 10 as regular event No. 2, whereas a run of length 2 would be characterized as special event No. 2. The event designation number is supplied by the event recognizer 10 on parallel cable 11 together with a bit on line 12 which indicates whether the designation number on line 11 refers to a regular event or a special event, and together with a signal on line 13 which indicates that the event designation information is available on cable 11 and line 12. An example of a suitable event recognizer will be described in detail hereinafter.

The signals from the event recognizer 10 are supplied to an encoder comprising select/combine circuitry 14, encoder tables 16, and shift-out circuitry 17. The encoder signals acceptance of the information on cable 11 and line 12 by providing an accept pulse signal on line 15 to the event recognizer 10. The information shown as being received on cable 11 in parallel may alternatively be supplied in the form of serial information over a single line. The parallel transmission of such information, however, appears to be the more efficient approach.

The select/combine circuitry 14 responds to the signal supplied from event recognizer 10 by selecting the appropriate entries from encoder tables 16 corresponding to the event designation appearing on cable 11 and line 12. The select/combine circuitry 14 then combines the selected values with the event designation number from cable 11 to generate a code word representation therefor, which is supplied to shift-out circuitry 17 for conversion from parallel to serial form.

Select/combine circuitry 14 is connected to the encoder tables 16 by lines 20, 21 and 22, and by cables 23 and 24. Line 21 comprises an enabling line operated by acceptance of the immediately prior code word by shift-out circuitry 17. The enabling signal, together with a pulse on line 20, causes the contents of tables to be loaded into table readout circuitry. Successive pulses on line 20 are used to operate the table readout circuitry. Line 22 comprises the special or regular signal from event recognizer 10 on line 12. Cables 23 and 24 comprises the outputs from the table readout circuitry which supply the table values to select/combine circuitry 14.

The select/combine circuitry 14 is connected to shift-out circuitry 17 by means of lines 25, 26 and 27, and by cables 28 and 29. Cable 29 comprises the codeword in parallel and includes enough lines to encompass the longest code word. Cable 28 comprises the designation of the length of the code word on cable 29 so that the unused lines comprising the remainder of cable 29 may be ignored. A signal on line 27 indicates that the code word is present on cable 29. Line 26 comprises an output from a clock source in select/combine circuitry 14 to control the enabling of circuitry 17. A pulse on line 25 indicates to the select/combine circuitry 14 that shift-out circuitry 17 has accepted the code word on cable 29.

Initialization circuitry is also provided which includes a reset input 30 that is supplied to inputs 31–33 to initially reset the encoding circuitry and is supplied via inverter 35 to AND circuit 36 to prevent initialization until the reset is complete. A start signal is supplied at input 37 to AND circuit 36. It is then supplied to inputs 38 and 39 of the encoding circuitry.

Shift-out circuitry 17 is connected to a transmission link or a storage device by lines 40–42. A signal on line 41 indicates that the codeword can be shifted out in serial form on line 40, and line 42 comprises an acceptance and timing line from the transmission link or storage device.

Referring now to a specific example of encoding select/combine circuitry 14, encoding table 16, and shift-out circuitry 17, FIGS. 2, 3–6, and 7 will be discussed.

Figure 2:
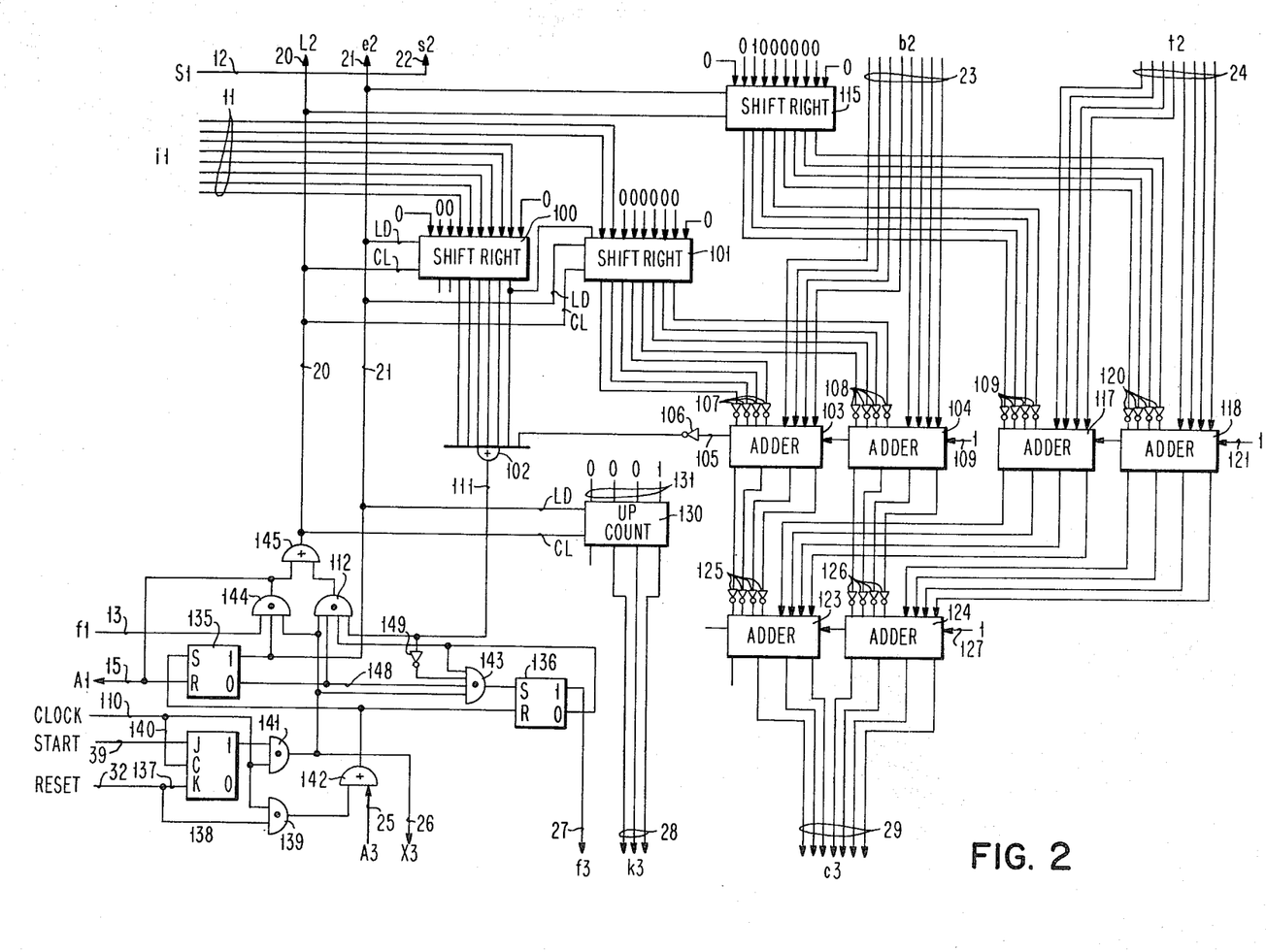
FIG. 2 is a detailed block diagram of one embodiment of an encoder select/combine apparatus 14 of FIG. 1.

Referring first to FIG. 2, an implementation of select/combine circuitry 14 is shown which employs standard semiconductor modular elements. Special input line 12 is connected directly to special output line 22 so that the line is employed directly to select the special or regular tabular values. The event designation cable 11 is connected to a shift register comprising shift-right units 100 and 101. These units are interconnected and are both connected to the same control lines 20 and 21 so as to comprise a single shift register arranged to shift only to the right. The contents of the shift register are directed to OR circuit 102 and to adders 103 and 104. The other input to the adders comprises cable 23 from the table readout circuitry. The carry output 105 from the adder circuitry is inverted by NOT circuit 106 and supplied to OR circuit 102. The inputs to the adder circuitry from shift register 100, 101 are first inverted by inverters 107, 108. The carry-in input 109 to the adder circuitry is supplied to a fixed voltage. The function of the resultant adder circuitry, inverters, and carry-in 109 is to subtract the binary value of the shift register 100, 101 from the binary value appearing on cable 23, and to provide an output from NOT circuit 106 to OR circuit 102 so long as the difference $(b-i)$ is less than 0. The subtraction is accomplished by adders in accordance with the well-known binary relationship of adding the complement of the number to be subtracted to the number from which it is to be subtracted and adding a binary 1 thereto, together with inverting the carry output 105 of the adder to obtain the sign of the result.

As will be shown, the selection of the proper table values from the table readout circuitry is controlled by OR circuit 102. The table selection circuitry is of significantly lower cost than the random access type. Thus, clock pulses from clock 110 sequences the table readout circuitry, as will be explained hereinafter, under the control of the output of OR circuit 102 on line 111 at gate 112, until the table values corresponding to the event designation number supplied on cable 11 is reached.

An alternative to this unique circuit arrangement is a random access memory for holding the tabular values. In that situation, the event designation number on cable 11 would be employed to operate addressing circuitry to directly or indirectly address the corresponding memory location.

Other circuitry in FIG. 2 comprises a shift register 115 whose function is to shift a binary 1 initially loaded at input 116 in conjunction with shifts of shift register 100, 101. As the shift register is always loaded with the same values, the inputs thereto are fixed to the appropriate voltage levels. The contents of shift register 115 are supplied to adders 117 and 118 via inverters 119 and 120. The carry-in input 121 of adder 118 is affixed to suitable voltage level to generate a 1. The function of adder circuitry 117, 118 is therefore the same as adder circuitry 103, 104, namely to accomplish a subtraction of the input thereto of shift register 115 from the input thereto of cable 24.

Similarly, adder circuitry 123, 124 including inverters 125, 126 and carry-in input 127 operate to subtract the outputs of circuits 103, 104 from the outputs of circuits 117, 118. The net result is supplied on output cable 29. All of the subtracting circuitry comprising circuit 103, 104, circuit 117, 118, and circuit 123, 124 combine the tabular values from cables 23 and 24 with the value of the event designation number on cable 11 to generate a code word on cable 29. Several shifting operations may be involved before the code word appropriate for the event designation appearing on cable 11 and line 12 is developed on cable 29. The presence of the appropriate code word is recognized by the absence of a signal from OR circuit 102 on line 111. The presence of a code word on cable 29 is indicated to shift-out circuit 17 by a signal on line 27, and the length of the code word is designated by the contents of counter 130, which appears on cable 28. Since every code word requires at least one bit, counter 130 is initially loaded with the binary value 0001, which is represented by inputs 131 thereto.

The operation of the circuitry of FIG. 2 is controlled by latches 135 and 136 and by clocked latch 138.

Upon latch 138 being in the reset state, the absence of a signal from the set output thereof disables AND circuit 141 to thereby block any clock pulses from AND circuits 112 and 144. The select/combine circuitry 14 can therefore neither receive event designation numbers on cable 11 nor transfer code words on cable 29. Hence, when latch 138 is reset, select/combine circuitry 14 is said to be in the disabled state.

Upon latch 138 being set, the signal from the set output thereof enables AND circuit 141 to transmit clock pulses from clock 110 to AND circuits 144, 112 and 143, and on line 26. The encoder is thus enabled and the operation of the encoder is determined by latches 135 and 136.

If latch 135 is set while latch 136 is reset, the circuitry of FIG. 2 is ready to receive the even designation from the event recognizer 10. If both latches 135 and 136 are reset, the circuitry of FIG. 2 is in the process of selecting the pre-established values from the table readout circuitry and combining those values with the event designation value. If latch 136 is set while 135 is reset, the selection and combination has been completed and a signal is provided on line 27 to indicate that the resultant code word is ready for transfer to shift out circuitry 17. These three states of latches 135 and 136 are designated ready to receive, selecting and ready to transfer. The fourth state of these latches, in which both are set, cannot occur.

The function control circuitry of the apparatus of FIG. 2 will now be described. At the beginning of a day's operation, the circuitry must be initialized. First, a reset signal is supplied at input 32. This signal is applied to input 137 of clocked latch 138 and to one input of AND circuit 139. Upon occurrence of the next clock pulse from clock 110 at input 140, latch 138 is reset. This prohibits any further outputs therefrom and thereby blocks gate 141. The reset signal is also applied to AND circuit 139 to gate the same clock pulse to OR circuit 142. OR circuit 142 then transmits the clock pulse to set latch 135, and to reset latch 136. The latches are therefore in the ready to receive state. Upon termination of the reset pulse, a start signal is supplied at input 39 to therefore set latch 138 upon occurrence of the next clock pulse from clock 110. Latch 138 thus operates AND circuit 141 to transmit subsequent clock pulses to line 26, to AND circuit 143, and to AND circuits 112 and 144. The select/combine circuitry 14 is thus placed in operable condition to receive event designations from event recognizer 10.

An event designation comprises presence or lack of a special designation signal on line 12, the presence of an event designation number on cable 11, and the appearance of a signal at line 13. The signal on line 13 indicates that the event designation is present on line 12 and cable 11. Thus, when latches 135 and 136 are in the ready to receive state, so that the set output from latch 135 provides an enabling input to AND circuit 144, a signal on line 13 enables AND circuit 144 to thereby gate a clock pulse appearing from AND circuit 141 to OR circuit 145. The first clock pulse so enabled is supplied by AND circuit 144 to event recognizer 10 over line 15 to thereby indicate that the event designation is being accepted. That signal is also supplied to reset the latch 135, as will be explained. The clock pulse is additionally supplied on line 20 to the clock inputs of shift register 115 and shift register 100, 101, and to counter 130. The operational signal from latch 135 on line 21 is also supplied to the load inputs of the same circuits. These circuits are arranged such that the signals at the data inputs thereto will be loaded into the registers or counter upon the combination of the load signal and a clock pulse. Thus, the fixed inputs to shift register 115 are loaded, the event designation from cable 11 together with various fixed signals are loaded into shift register 100, 101, and the fixed count is loaded into counter 130. As will be explained, the combination of the signal on line 21 and the pulse on line 20 also operates the encoder tables 17 to load the table readout circuitry. Thus, initial outputs are received on cables 23 and 24 therefrom and supplied to the subtraction equivalency circuits 103, 104 and 117, 118. The outputs of these circuits are supplied to circuits 123, 124 which produces an output on cable 29.

As mentioned above, the clock pulse supplied by AND circuit 144 to event recognizer 10 over line 15, which is gated by a signal on line 13 when latches 135 and 136 are in the ready to receive state, that is when latch 135 is set and latch 136 is reset, also serves to reset latch 135. This, together with the reset condition of latch 136, designates the selecting state.

When latches 135 and 136 are in the selecting state, the reset outputs from these two latches provide enabling inputs to AND circuits 112 and 143. So long as OR circuit 102 generates a positive signal, which indicates that the outputs on cable 29 do not represent the code word for the previously received event designation, line 111 provides an enabling input to AND circuit 112 and inverter 149 disables AND circuit 143. In such cases, a clock pulse appearing from AND circuit 141 is gated through AND circuit 112 and OR circuit 145 to line 20. This clock pulse, together with the absence of a signal from the set output of latch 135, causes counter 130 to be incremented, causes shift register 100, 101 to be shifted right by one position, causes shift register 115 to be shifted right by one position, and as will be explained, causes the table readout circuitry to alter the outputs on cables 23 and 24. The resulting contents of shift circuitry 100, 101 and 115, together with the new values on cables 23 and 24, supply new inputs to substraction equivalency circuits 103, 104 and 117, 118, and the outputs from these circuits provide new inputs to circuits 123, 124, which in turn generate new outputs on cable 29. Additionally, the altered contents of shift register 100 and the new carry from adder 103, which is inverted by inverter 106, provide new inputs to OR circuit 102.

When latches 135 and 136 are in the selecting state, so that the reset outputs from both latches provide enabling inputs to AND circuits 112 and 143, the absence of a positive signal from OR circuit 102 disables AND circuit 112 and causes inverter 149 to enable gate 143. In such cases a clock pulse from AND circuit 141 sets latch 136. This, together with the reset condition of latch 135, designates the ready to transfer state.

When latches 135 and 136 are in the ready to transfer state, so that latch 135 is reset and latch 136 is set, the set output from latch 136 provides a signal on line 27 to shift out circuit 17. Shift out circuit 17 answers the signal on line 17 by supplying an accept pulse on line 25. This pulse is transmitted by OR circuit 142 to set latch 135 and reset latch 136, thereby returning these latches to the ready to receive state.

Figure 3:
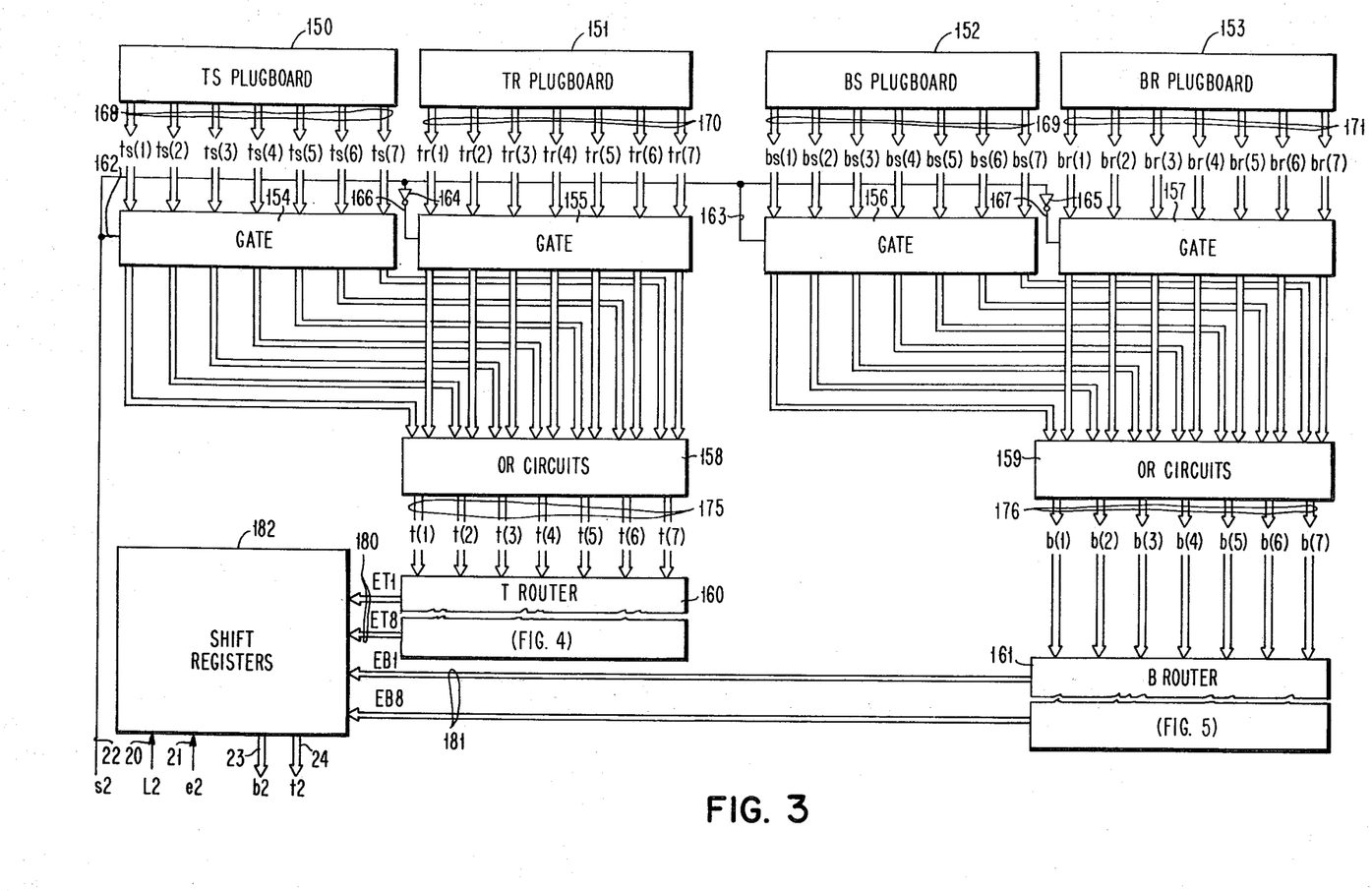
FIG. 3 is a more detailed block diagram of an embodiment of encoder tables 16 of FIG. 1.

Encoder tables 16 of FIG. 1 are illustrated in detail in FIG. 3.

The encoder tables include a series of plugboards 150–153, the outputs of which are selectively gated by gating circuits 154–157 and OR circuits 158 and 159 to matrix routers 160 and 161. The plugboards 150–153 comprise standard commercially available plugboards which may be wired in accordance with a desired code. An example of such a code will be illustrated hereinafter. Plugboards 150 and 152 represent the pre-established values to be selected for special events. Plugboards 151 and 153 comprise the pre-established values to be selected for regular events.

Special event line 22 is supplied directly to inputs 162 and 163 of gate circuits 154 and 156. It is also supplied via inverters 164 and 165 to inputs 166 and 167 of AND gates 155 and 157. Thus, upon the appearance of a special event indicator signal on line 22, AND gates 154 and 156 are operated to supply the outputs 168 and 169 of plugboards 150 and 152 to OR circuits 158 and 159. Inverters 164 and 165 invert the special input signal to block gates 155 and 157 from supplying outputs 170 and 171 from plugboards 151 and 153 to OR circuits 158 and 159. Similarly, when the event is recognized as regular instead of special, the lack of a signal on line 22 blocks gates 154 and 156 and is inverted by inverters 164 and 165 to operate gates 155 and 157 to transmit the information at the outputs of plugboards 151 and 153 to the OR circuits 158 and 159.

The OR circuits transmit all information gated thereto over the corresponding outputs 175 and 176 to the respective matrix router 160 or 161. The routers then supply the signals over the respective output lines 180 or 181 to shift registers 182. Finally, these signals on lines 180 and 181 are loaded into shift registers 182 in response to a pulse on line 20 in conjunction with a load signal on line 21. Shift registers 182 are then operated by pulses on line 20, and the absence of a load signal on line 21, to sequence through the loaded pre-established table values until the values on cables 23 and 24 are those corresponding to the event designation to be encoded. Thus, the gate and OR circuits are employed to select the proper set of plugboards, and the routers are employed to arrange the outputs of the plugboards in the proper sequence for selection by the select/combine circuitry 14 through cables 23 and 24 in response to shift pulses on line 20 to shift registers 182.

Figure 4:
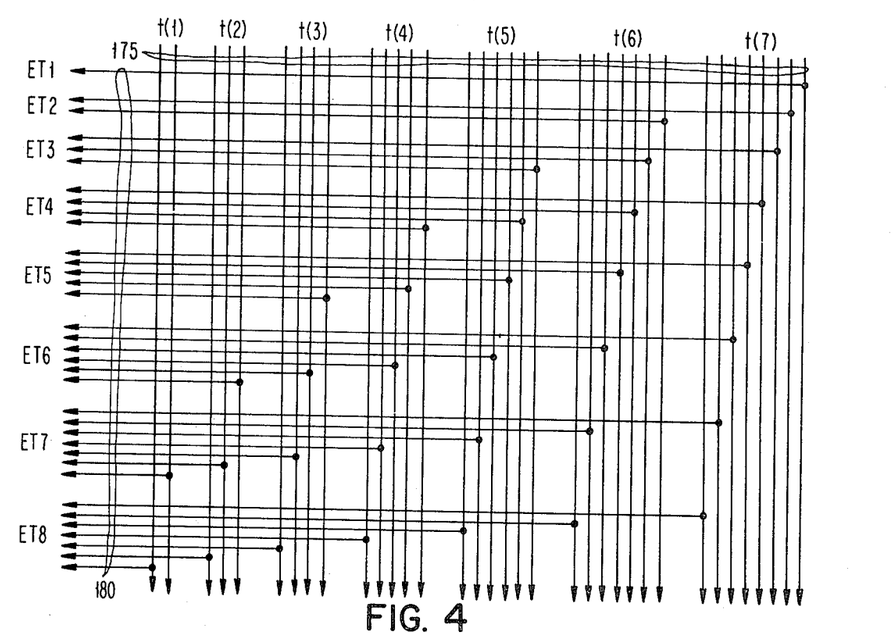
FIG. 4 is a detailed diagram of a T router 160 of FIG. 3.
Figure 5:
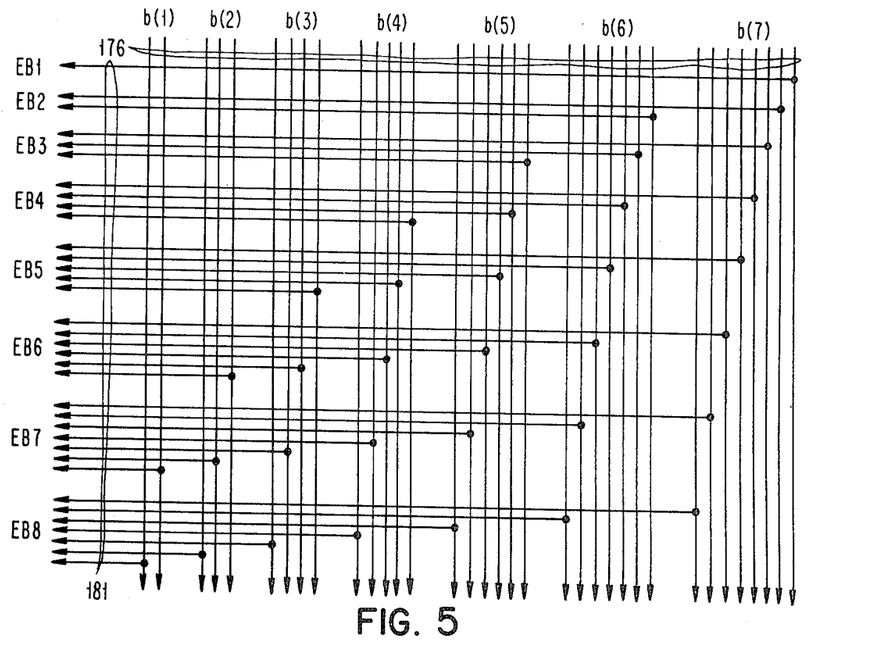
FIG. 5 is a detailed diagram of a B router 161 of FIG. 3.

Routers 160 and 161 are shown respectively in FIGS. 4 and 5. The routers illustrated comprise simply a matrix connection between the output lines 175 and 176 of OR circuits 158 and 159 the inputs 180 and 181 of shift registers 182. Using router 160 in FIG. 4 as an example, the eighth bit of input $t(7)$, counting from the left, becomes output ET1. The seventh bit in each of $t(6)$ and $t(7)$, again counting from the left, becomes output ET2. The number of lines represented by ET3, ET4, ET5, ET6 and ET7 are seen to increase by one until ET7 is reached. ET7 thus includes seven lines. ET8 also has seven lines, which are the high order bit position of each of the plugboard outputs, $t(1)$ through $t(7)$. The router of FIG. 5 is arranged in the identical manner to that of FIG. 4.

Figure 6:
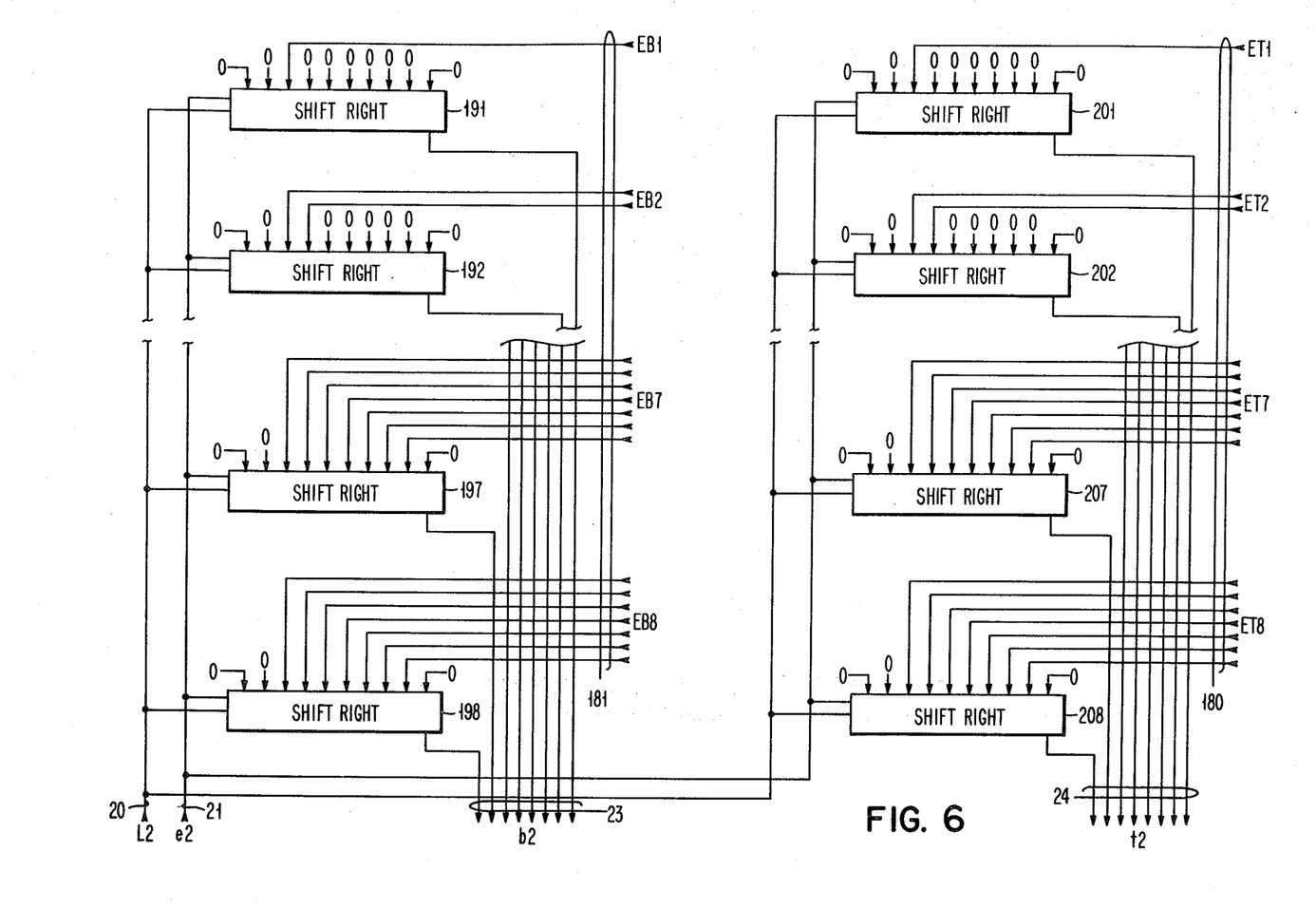
FIG. 6 is a detailed block diagram of shift registers 182 of FIG. 3.

Referring now to FIG. 6, the shift registers 182 are illustrated. The router outputs are contained in cable 181 and comprising outputs EB1 through EB8 from router 176 are connected to shift registers 191 through 198 respectively. Similarly, the router outputs comprising cable 180 and comprising individual outputs ET1 through ET8 from router 175 are connected to the shift registers 201 through 208, respectively. The shift registers are all arranged so that the combination of the load signal on line 21 accompanied by a clock pulse on line 20 loads the shift registers with the information comprising cables 181 and 180. Certain load input positions of each shift register are designated as 0 and are connected to an appropriate permanent voltage to designate the binary 0. An example is connecting these inputs to ground. The combination of the load signal on line 21 with the clock pulse on line 20 similarly loads the zero inputs into the shift registers. As is seen, the rightmost bit from each of shift registers 191–198 are provided on cable 23 and the rightmost bits of shift registers 201–208 are supplied on cable 24.

Should OR circuit 102 in FIG. 2 indicate by a signal on line 111 that the pre-established values corresponding to the event designation are not yet present on cables 23 and 24, the signal on line 111 gates a clock pulse from clock 110, via AND circuit 112 and OR circuit 145, to line 20. The clock pulse, accompanied by the absence of a load signal on line 21, operates all of the shift registers 191–198 and 201–208, causing them to shift one bit to the right. Thus, a new set of data is supplied from the shift registers on cables 23 and 24. The shifting continues until such time as OR circuit 102 in FIG. 3 indicates that the pre-established values corresponding to the event designation have been selected.

Figure 7:
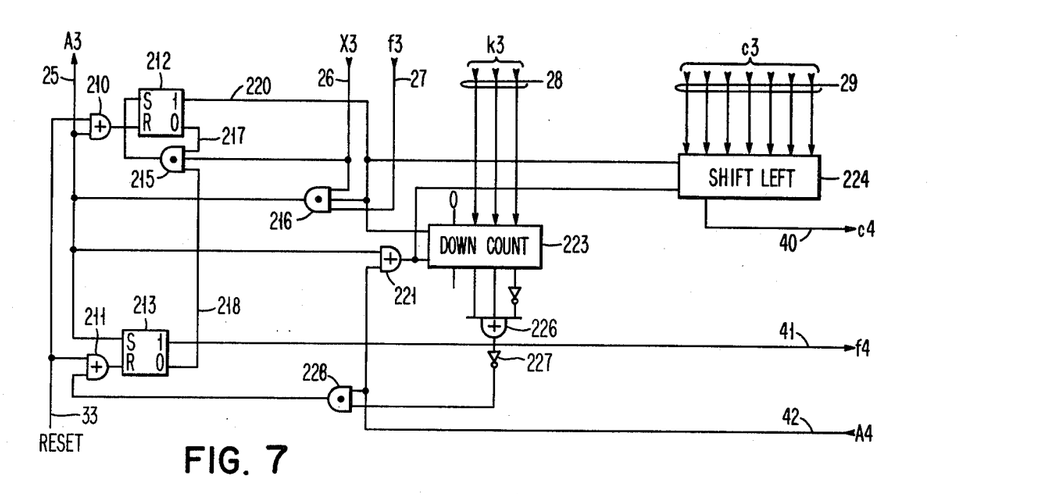
FIG. 7 is a detailed block diagram of an embodiment of shift-out circuitry 17 of FIG. 1.

FIG. 7 illustrates the shiftout circuitry 17 in greater detail. As will be explained, the code word on cable 29 and the corresponding code word length on cable 28 are loaded into shift register 224 and counter 223, respectively, in response to a clock pulse transmitted by the encoder select/combine circuitry 14 on line 26. Subsequently, as will be explained, clock pulses supplied on line 42 by the transmission link, data storage device or decoder receiving the transmitted code word cause shift register 224 to be shifted left so that successive bits of the code word becomes available on line 40. The clock pulses on line 42 also serve to decrement counter 223, which is used to indicate when the entire code word has been transmitted over line 40.

The operation of the shift out circuitry 17 in FIG. 7 is controlled by latches 212 and 213, in much the same way that latches 135 and 136 control the operation of the select/combine circuitry 14 in FIG. 2. If latch 212 is set and latch 213 is reset, then shift out circuit 17 is ready to receive a code word and the corresponding code word length from select/combine circuitry 14 on cables 29 and 28, respectively. If latch 212 is reset and latch 213 is set, then shift out circuit 7 is either ready to transmit the code word or is in the process of serial transmission of the code word over line 40. These two states of latches 212 and 213 are called the ready to receive and the ready to transmit states, respectively. Since the clock pulses appearing on lines 26 and 42 may well be derived from different clocks, timing considerations require a third state for latches 212 and 213, called the transitional state, in which both latches are reset. The latches are never simultaneously set.

Reset input line 33 to shift out circuit 17 is connected to the reset input 30 of FIG. 1 and is connected, via OR circuits 210 and 211, to latches 212 and 213. Thus, a reset signal serves to reset both latch 212 and 213, thereby placing the circuit in the transitional state.

When latches 212 and 213 are in the transitional state, so that both latches are reset, the reset output of latch 212 on line 217 and the reset output of latch 213 on line 218 serve as enabling inputs to AND circuit 215. Also, the absence of a signal from the set output from latch 212 on line 220 serves to disable AND circuit 216. Thus, when latches 212 and 213 are in the transitional state, a clock pulse appearing from select/combine circuitry 14 on line 26 is transmitted via AND circuit 215 to set latch 212, thereby placing latches 212 and 213 in the ready to receive state.

When latches 212 and 213 are in the ready to receive state, so that latch 212 is set and latch 213 is reset, the set output from latch 212 on line 220 provides an enabling input to AND circuit 216, while the absence of a signal from the reset output of latch 212 on line 217 serves to disable AND circuit 215. Additionally, the signal on line 220 provides a load enable input to counter 223 and shift register 224.

Select/combine circuitry 14 indicates that a code word and the corresponding code word length are available on cables 29 and 28, respectively, by supplying a signal on line 27. This signal serves as an enabling input to AND circuit 216 in FIG. 7. If latches 212 and 213 are in the ready to receive state, so that the set output of latch 212 on line 220 provides an enabling input to AND circuit 216, then the clock pulse from select/combine circuitry 14 on line 26 immediately following the appearance of a signal on line 27 is gated by AND circuit 216 to OR circuit 221, and thereby to counter 223 and shift register 224. The signal operates in conjunction with the set output from latch 212 on line 220 to load the information on cables 28 and 29 into counter 223 and shift register 224, respectively. The clock signal gated by AND circuit 216 is additionally supplied on line 25 to select/combine circuitry 14 to thereby indicate that the information on cables 28 and 29 has been accepted and loaded into counter 223 and shift register 224. Lastly, the clock signal gated by AND circuit 216 serves to set latch 213 and is transmitted via OR circuit 210 to reset latch 212, thereby placing the latches in the ready to transmit state.

When latches 212 and 213 are in the ready to transmit state, so that latch 212 is reset and latch 213 is set, the absence of a signal from the set output of latch 212 on line 220 serves to disable AND circuit 216 and the absence of a signal from the reset output of latch 213 on line 218 disables AND circuit 215. Also, the absence of a signal on line 220 serves as a count enable input to counter 223 and a shift enable input to shift register 224. The set of latch 213 output of a signal on line 41 to the transmission link, data storage device, or decoder which responds by supplying clock pulses on line 42. These clock pulses are transmitted via OR circuit 221 to decrement counter 223 by one and to shift the contents of shift register 224 to the left by one bit position. The clock pulses are also transmitted to AND circuit 228, which is disabled by OR circuit 226 and inverter 227 until the contents of counter 223 is reduced to 001. When the contents of counter 223 is reduced to 001, which indicates that only one bit of the code word in shift register 224 remains to be transmitted on line 40, a clock pulse on line 42 is gated by AND circuit 228 and OR circuit 211 to reset latch 212, thereby returning latches 212 and 213 to the transmit state.

Figure 8:
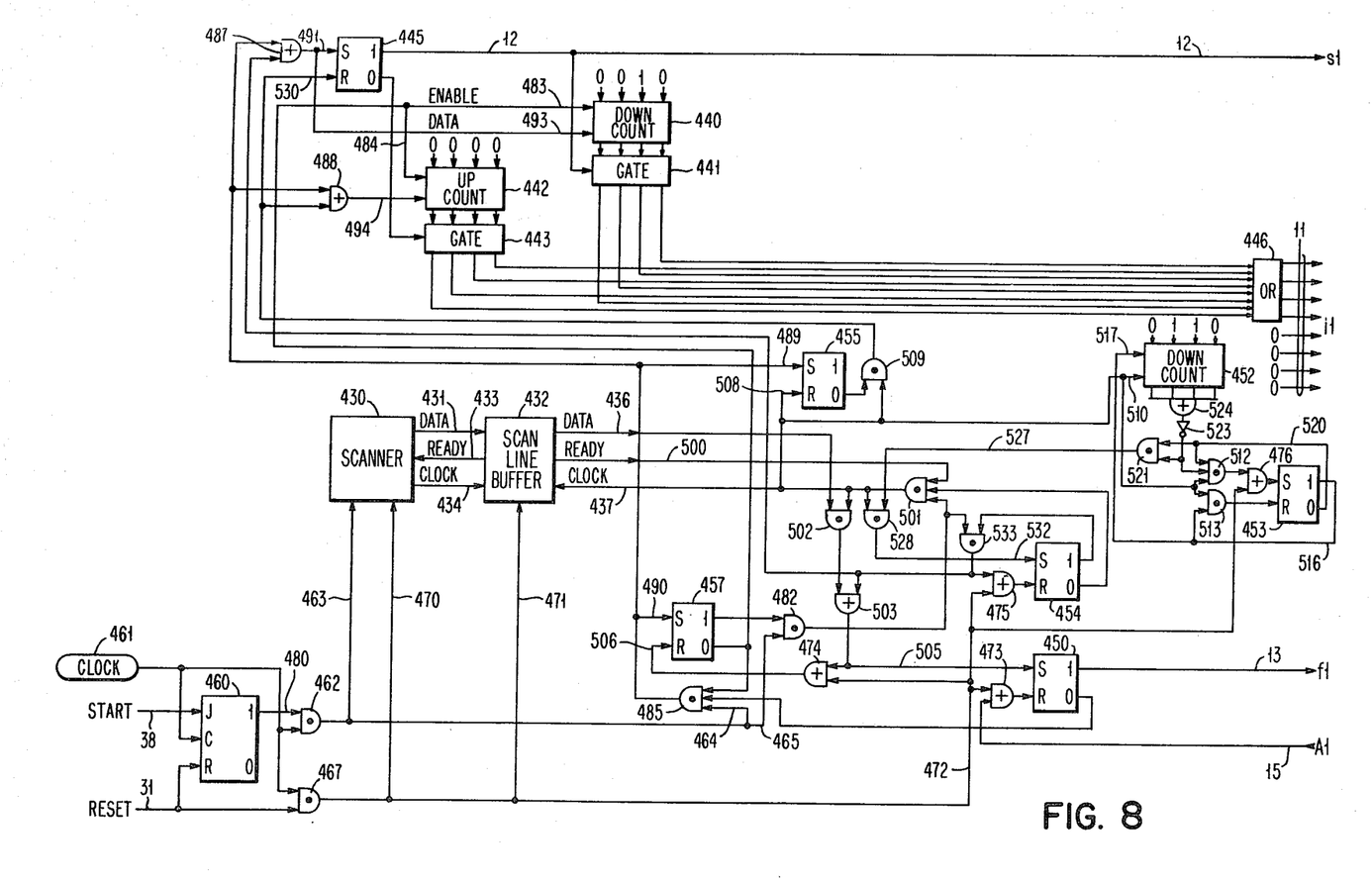
FIG. 8 is a detailed block diagram of an embodiment of an event recognizer 10 of FIG. 1.

Exemplary input and output units which establish or utilize the data compressed and decoded by the described circuitry will not be discussed. FIG. 8 describes an exemplary event recognizer 10 of FIG. 1.

The source of data in the event recognizer is a scanner 430. The scanner may be of any suitable type, such as of the vidicon type. For the purpose of illustration, the scanner is assumed to be scanning character image information in the form of eight-bit horizontal scans. The data is supplied on line 431 to a set of scan line buffers 432. The scan line buffers supply a ready signal on line 433 to initiate a scan operation. Scanner 430 also supplies clock signals on line 434 to the scan line buffer. The data supplied by the scanner on line 431 to the scan line buffers merely comprises ones and zeroes representing the black or white significance of each bit position of the scanned image.

The scan line buffers 432 subsequently supply data from line 436 in response to clock signals on line 437 to operate the event recognizer circuitry. The event recognizer circuitry responds to all runs of data to produce an event designation number in parallel on cable 11 and to provide a special event indicator on line 12 when appropriate. For the purpose of the illustration, a run is defined as a one or as a string of one or more zeros and the first one following this string of zeros. If the string of zeroes terminates in an end of line for the scan rather than with a one, the entire string is considered simply as the end of line special event. In the exemplary circuitry of FIG. 8, the special events include as special event 1, the end of line, and as special event 2, a run of length 1. Regular events No. 1 through No. 6 are, respectively, runs of lengths 2 through 7, so that the regular event designation number for a run is the length of that run minus one. That is, the regular event designation number is precisely the number of zeroes in the run. Thus, a run of length 2 (which is a 01) is regular event No. 2.

As an example, a scan line of eight consecutive zeroes and no ones, is encoded simply as an end of line, special event No. 1. For further illustration, a scan line comprising seven consecutive zeroes followed by a one, is encoded as a run of length 8, regular event No. 7, followed by an end of line, special event No. 1. Conversely, if the scan line comprises a string of eight consecutive one bits, the circuitry of FIG. 8 encodes this as eight consecutive runs of length 1, special event No. 2 eight times, followed by an end of line, special event No. 1. Further, a scan line comprising seven consecutive one bits, followed by one zero bit, will be encoded as seven runs of length 1, special event No. 2 seven times, followed by an end of line, special event No. 1.

As a further example, a scan line comprising the following eight bits, 00110100, is defined by the exemplary event recognizer as comprising a run of length 3, followed by a run of length 1, followed by a run of length 2, followed by an end of line. This would thus be encoded as regular event No. 2, followed by special event No. 2, followed by regular event No. 1, followed by special event No. 1.

In FIG. 8, down counter 440 establishes the special event designation number which may be gated to cable 11 by gate circuit 441. Up counter 442 establishes the regular event designation number, which may be gated to cable 11 by gate circuit 443. Latch 445 controls gates 441 and 443, and indicates whether the event is regular or special by supplying a signal on line 12 when the event is a special event. OR circuits 446 transmit the output of gate 441 or gate 443 to cable 11. As the circuitry of the exemplary event recognizer provides a maximum event designation number of seven, OR circuit 446 is connected to only four lines of cable 11. The remaining four lines of the cable are permanently supplied with a voltage level that indicates a binary zero. Several signals may appear on cable 11 or on line 12 until a definite event designation is selected. At the time an event is selected, latch 450 supplies a signal on line 13. Subsequently, encoder 14 signals acceptance of the available data by supplying a clock pulse on line 15.

Counter 452 is preset to a binary count of six with the first pulse of each scan line and is subsequently decremented by each clock pulse to reach a count of zero immediately prior to the last pulse of the scan line. Latches 453 and 454 then combine to operate latch 445 and counters 440 and 442 to indicate a run followed by an end of line special event No. 1 if the last data bit on line 436 was a one, or to simply indicate an end of line, special event No. 1 if the last data bit on line 436 was a zero.

Latch 455 is employed to block one clock pulse from counter 442 during the counting of subsequent zeroes as data from line 436. This allows the output of counter 442 to be one less than the total run length, which is required because each regular event designation number is one less than the run length that it designates.

Lastly, latches 450 and 457 control the operational characteristics of the event recognizer circuitry in the following way. Immediately following a reset signal that was applied to line 31, both latches 457 and 450 are reset and the event recognizer circuitry is ready to accept data from scan line buffers 432, when the circuitry of FIG. 8 is ready to transfer data on cable 11 and line 12, latch 457 is reset and latch 450 is in the set state. The situation where both latches are set cannot exist.

Referring now in more detail to the operation of the circuitry of FIG. 8, clock latch 460 control the initialization of the event recognizer circuitry.

Inputs to latch 460 comprise start line 38, reset line 31 and clock 461. Upon application of a reset signal on line 31, the subsequently appearing clock pulse from clock 461 will operate to reset latch 460. Resetting the latch 460 will operate to block AND circuit 462 to prevent the application of clock pulses to lines 463, 464 or 465. Also, the combination of the reset signal on line 31 and the clock pulse will operate AND circuit 467 to supply a reset pulse to scanner 430 on line 470, to the scan line buffers 432 on line 471, and to the event recognizer circuitry on line 472. The reset pulse on line 472 is transmitted by OR circuits 473, 474 and 475 to reset latches 450, 457 and 454, and transmitted by OR circuit 476 to set latch 453.

A subsequent start signal on line 38 causes latch 460 to operate to the set state upon the next following clock pulse from clock source 461. In this state, latch 460 supplies a signal on line 480. Thus, subsequent clock pulses from source 461 will be gated by AND circuit 462 to scanner 430 on line 463 and to the event recognizer circuitry on lines 464 and 465. Clock pulses are supplied to the scan line buffers 432 from scanner 430 on line 434 and from the event recognizer circuitry on line 437.

The set output of latch 457 is connected to AND gate 482. As the latch is initially reset, AND circuit 482 blocks clock pulses on line 465 from the event recognizer circuitry. The reset output of latch 457 is applied to enabling input 483 of counter 440, to enabling input 484 of counter 442, and to AND circuit 485. The reset output of latch 450 provides a further enabling input to AND circuit 485. AND circuit 485 thus gates the first clock pulse from AND circuit 462 to OR circuit 487, OR circuit 488, to the set input 489 of latch 455 and to the set input 490 of latch 457. OR circuit 487 transmits the clock pulse to set input 491 of latch 445. This operates latch 445 to supply a special event output signal on line 12 and a signal to operate gate 441. OR circuit 487 also transmits the clock pulse to the pulse input 493 of counter 440. The combination of the enable signal on line 483 with the pulse on line 493 operates counter 440 to load an initial count of a binary two. As latch 445 has operated gate 441, a binary two is supplied by the gate to OR circuit 446 for output on cable 11. The event recognizer circuitry is therefore arranged to indicate a special event No. 2 if the first data bit detected from the scan line buffer on line 436 is a binary one.

OR circuit 488 transmits the clock pulse from AND circuit 484 to input 494 of counter 442. The combination of the enabling signal at input 484 with the clock pulse on line 494 causes counter 442 to be loaded with an all-zero input.

Assuming that the scan line buffers 432 are ready to supply a scan line of data to the event recognizer, a signal is supplied therefrom on line 500 to AND circuit 501. Thus AND circuit 501, under the control of line 500 and latch 454, transmits clock pulses to the event recognizer circuitry and on line 437 to the scan line buffers 432 to control the transfer of scan line data information to the event recognizer circuitry.

In that the ready signal remains present on line 500, latch 457 remains set, and latch 454 remains reset, a clock pulse appearing at input 465 is gated by AND circuits 482 and 501 to line 437. This clock pulse operates the scan line buffers to acknowledge receipt of the first data bit on line 436. The output of AND circuit 501 is also supplied to input 510 of counter 452 and to AND circuits 512 and 513. AND circuits 512 and 513, together with countr 452 and latch 453, operate to count the clock pulses supplied on line 437 to the scan line buffers, and thereby count the scan line length, and thereby detect the end of a scan line.

Specifically, the previously considered reset pulse on line 472, transmitted by OR circuit 476, sets latch 453. The latch therefore supplies an output on line 516 to enable AND circuit 513 and to supply an enable signal at input 517 of counter 452. The absence of a signal from the set output of latch 453 served to block AND circuit 512. As previously discussed, application of the clock pulse from AND circuit 501 on line 437 to the scan line buffers also results in application of the clock pulse to input 510 of counter 452. The combination of the clock pulse at input 510 with the enabling signal on line 517 results in loading counter 452 with the binary input 0110, which is equal to a decimal 6. The same clock pulse is gated by AND circuit 513 to the reset input of latch 453. This resets the latch to terminate the signal on line 516 and at input 517 of the counter 452. Subsequent clock pulses at input 510 to the counter will therefore serve to decrement the count.

The second clock pulse appearing at input 510 therefore causes counter 452 to decrement to a binary count of 5. Each subsequent clock pulse similarly decrements the counter such that the third clock pulse decrements the count to 4, the fourth clock pulse decrements the count to 3, the fifth clock pulse decrements the count to 2, the sixth clock pulse decrements the count to 1, and the seventh clock pulse decrements the count to 0. Under all conditions of the counter except for 0, the counter supplies a 1 output on at least one of its output lines to OR circuit 524, so that the OR circuit thus supplies a signal to inverter 523, which therefore blocks AND gates 512 and 521.

Upon occurrence of the seventh clock pulse, which decrements counter 452 to 0, OR circuit 524 then supplies no signal to inverter 523 which therefore supplies a signal to enable AND circuits 512 and 521. The combination of the reset output signal on line 520 from latch 553 with the signal from inverter 523 causes AND circuit 521 to transmit a signal on line 527 to AND circuit 528.

The signal on line 527 is the indication that the subsequent clock pulse supplied on line 437 will acknowledge receipt from the scan line buffers 432 of the last bit of the scan line.

The description now returns to the response of the event recognizer circuitry to the first data bit appearing on line 436 from the scan line buffers.

If the first data bit is a one, the combination of the clock pulse from AND circuit 501 and the data signal on line 436 operate AND circuit 502 to supply a clock pulse to OR circuit 503. OR circuit 503 transmits the pulse to set input 505 of latch 450 and, via OR circuit 474, to reset input 506 of latch 457. This sets latch 450 and resets latch 457, thereby placing the event recognizer circuitry in the condition where it is ready to transmit data and not ready to receive data. Latch 457 therefore prevents further clock pulses from being transmitted by AND circuit 482 to the clock input 437 of the scan line buffers 432. The setting of latch 450 supplies an output signal on line 13 to the encoder 14 of FIG. 1, to indicate that an event designation is present on cable 11 and line 12. It will be recalled that the output of the event recognizer circuitry at this time comprises a special event signal on line 12 and the event designation number 2 on cable 11 from counter 440. Thus, special event No. 2 is indicated, which comprises a run of length 1, or a one appearing at line 436 not following a string of zero bits.

On the other hand, if the first data bit of the scan line is a zero, than no signal is supplied to AND circuit 502, which therefore blocks the clock pulse appearing from AND circuit 501. The clock pulse operates to reset latch 455 at input 508 thereto and operates to decrement counter 452 at input 510. The clock pulse further operates on line 437 to acknowledge receipt of the next data bit from scan line buffers on line 436. Finally, the clock pulse is transmitted to AND circuit 509, which is blocked by the absence of a signal from the reset output of latch 455.

The initial zero data bit and the clock pulse which acknowledges it has no other effect on the event recognizer circuitry than to reset latch 455 and decrement counter 452.

Assuming that the end of line has not yet been reached, the next clock pulse appearing on line 465 will be transmitted by AND circuits 482 and 501 to line 437, to input 508 of latch 455, to AND circuit 509 and to input 510 of counter 452. In this instance, however, latch 455 has been previously reset and now supplies a gating signal to AND circuit 509. AND circuit 509 therefore transmits the clock pulse via OR circuit 488 to input 494 of counter 442 and to input 530 of latch 445. This pulse increments counter 442 to a count of 1 and resets latch 445. Resetting latch 445 terminates the signal on line 12 and blocks gate 441 to prevent further application of the special event designation signal and the special event designation number at the output. Resetting latch 445 also causes the reset output of the latch to apply a signal to gate 443 to transmit the regular event designation number of 1 from the counter 442 to the output. The result occurs whether or not the data bit from the scan line buffers is a one or a zero. If the data bit is a zero, nothing further occurs. If the data is a one bit, its results will be explained later.

Subsequent consecutive zero bits in the scan line buffer result in the continued incrementing of counter 442 for each applied clock pulse. Thus, the output appearing therefrom on cable 11 is equal to one less than the number of applied clock pulses.

Upon encountering a one bit on line 436, AND circuit 502 and OR circuits 503 and 474 transmit the clock pulse to input 505 of latch 450 and to input 506 of latch 457. This pulse therefore alters the condition of both latches, setting latch 450 and resetting latch 457. Resetting latch 457 causes AND circuit 482 to prevent the application of any further clock pulses on line 465 to the event recognizer circuitry and to scan line buffers 432. The set output from latch 450 on line 13 indicates to the encoder 14 in FIG. 1 that the output on cable 11 and line 12 represents the next event to be encoded. The event designation number on cable 11 is therefore the last count of counter 442 and the absence of a signal on line 12 indicates that a regular event designation number is available on cable 11.

Upon the encoder circuitry 14 of FIG. 1 indicating by a pulse on line 15 that the data on cable 11 and line 12 has been accepted, OR circuit 473 transmits the pulse to latch 450. Latch 450 is reset to terminate the signal on line 13 and the reset output supplies a signal to AND circuit 485. Latch 457 remains in the reset condition from the data pulse applied via AND circuit 502 and OR circuits 503 and 474 representing the initial one bit, or the one bit following one or more zeroes. Thus, latch 457 supplies its reset signal to AND circuit 485. The combination of the reset outputs from latches 457 and 450 cause the next succeeding clock pulse to be gated by AND circuit 485 to set latch 445, to load counter 440 by the combination of the signal on line 483 and the pulse on line 493, to load counter 442 by means of the signal on line 484 and the pulse on line 494 and to set latches 455 and 457 by means of the pulses on lines 489 and 490.

The setting of latch 457 allows the subsequent clock pulse on line 465 to be transmitted to AND circuit 501. As we are not yet at the end of line, latch 454 continues to supply a reset output to AND circuit 501, and, assuming that the scan line buffer remains in the ready state, a signal is supplied therefrom on line 500 to AND circuit 501. The recognition of further runs proceeds in a manner identical to that described for recognizing the first run of the scan line.

The end of line situation will now be discussed. Upon encountering the seventh clock pulse to strobe the scan line buffers, counter 452 goes to zero. As previously described, this count results in the application of a signal to AND circuit 521, which, since latch 453 is reset, is transmitted onto line 527. The signal on line 527 therefore enables AND circuit 528 to transmit the next appearing clock pulse.

Two conditions are possible. The last data bit of the scan line is either a zero or a one. If the last data bit is a one, the event recognizer circuitry will transmit a regular event designation signal on line 12 and an event designation number on cable 11 indicating the number of zeroes preceding the one bit, or the event recognizer circuitry will transmit the special event designation No. 2 to indicate that the last data bit was a one which was preceded by a one bit. Subsequently, the event recognizer circuitry will transmit an end of line event designation which is special event No. 1. On the other hand, if the last data bit of the scan line is a zero, no regular or special events indicating runs will be transmitted. Rather, only the end of line special event designation will be transmitted.

Preparatory to receipt by event recognition circuitry of the last data bit of a scan line, AND circuits 482, 501, 512 and 528 are enabled. AND circuit 509 may also be enabled, depending upon whether the previous data bit was a zero. A clock pulse on line 465 is therefore transmitted via AND circuit 482 and AND circuit 501 to line 437 and to AND circuits 502, 509, 512 and 528. The clock pulse on line 437 operates to strobe the scan line buffers to acknowledge the data bit on line 436. If the data bit is zero, nothing occurs at AND circuit 502. If, however, the data bit is a one, AND circuit 502 operates to transmit the pulse, via OR circuits 503 and 474, to latches 450 and 457. This will operate the latches to prevent application of the next clock pulse to the event recognizer circuitry and to supply a signal on line 13 to the encoder circuitry 14 of FIG. 1. Whether or not the data bit is a one, AND circuit 509, if enabled, transmits the clock pulse to latch 445 and to counter 442. This results in the application of the proper regular event designation number to gate 443. Also, the clock pulse is transmitted by AND circuit 528 to input 532 of latch 454. This operates the latch to the set condition to terminate the reset output therefrom to AND circuit 501 and thereby block any further clock pulses from transmittal to the scan line buffers 432. This also operates the latch to supply a signal from the set output to AND circuit 533, enabling the AND circuit for the next clock pulse from AND circuit 482.

Lastly, the clock pulse is transmitted by AND circuit 512 and OR circuit 476 to the set input of latch 453. The latch is therefore set to terminate the output on line 520, which thereby blocks AND circuits 521 and 528. The latch also supplies a signal on line 516 to input 517 of counter 452. Thus, counter 452 is in condition to be loaded upon subsequent enabling of AND circuit 501 for beginning the next scan line.

As previously described, if the last data bit of the scan line 2343 a one, latch 457 is reset and latch 450 is set, so that a signal on line 13 indicates to the encoder the availibility of an event designation on cable 11 and line 12. As before, the encoder circuitry signals acceptance of the event designation by application of a pulse on line 15. This pulse resets latch 450, and leaves latch 457 rest, so that the next clock pulse on line 465 serves to set latches 457, 445 and 455, and to load counter 440 with a count of 2.

It will be recalled that if the last data bit of the scan line were a zero, latch 445 remains reset and counter 440 remains set with the count of 2, it having not been pulsed subsequent to loading.

Upon acceptance by encoder 14 of the event information particularized by a one data bit at the end of the scan line, followed by one clock pulse on line 464, or upon the event recognizer circuitry operating without further response to a zero data bit at the end of the scan line, latch 457 is in the set condition, latch 450 is in the reset condition and counter 440 holds the value 2. The next clock pulse on line 465 is thus transmitted by AND circuit 482 to AND circuit 533. As latch 454 was previously set to indicate that the previous data bit was at the end of a scan line, AND circuit 533 gates the clock pulse, which is blocked by AND circuit 501. Thus, no further data is acknowledged from the scan line buffers 432 by AND circuit 501 and line 437.

The clock pulse from AND circuit 533 is supplied via OR circuit 487 to input 491 of latch 445 and to pulse input 493 of counter 440. This operates to set latch 445, if it is not already in that condition, so that it supplies a signal on line 12 and enables gate 441. The pulse also operates to decrement counter 440 to a binary condition of 1.

The pulse output of AND circuit 533 is also supplied to OR circuit 503, which transmits the signal, via OR circuit 474, to reset latch 457 and to set latch 450. Latch 450 therefore indicates by means of a signal on line 13 that data is available on line 12 and cable 11. As discussed, this data is available on line 12 and cable 11. As discussed, this data comprises special event No. 1, the end of line event designation.

Lastly, the pulse output of AND circuit 533 is supplied via OR circuit 475 to reset latch 454. The latch thus indicates that the end-of-line condition is terminated, and supplies an output signal to AND circuit 501 to ready the event recognizer circuitry to again strobe the scan line buffers 432, depending upon the presence of the ready signal therefrom on line 500.

The apparatus illustrated in FIG. 8 is merely an example of an event recognizer 10 in FIG. 1 for supplying various event designations to encoder circuitry 14. Many alternative types of event recognizers may be employed to supply suitable data to the described compression encoding apparatus.

While the invention has been particularly shown and described with reference to preferred embodiments thereof, it will be understood by those skilled in the art that various changes in form and details may be made therein without departing from the spirit and scope of the invention.

What is claimed is:

1. An apparatus for encoding binary event designations for various ordinary and extended run-length codes, the codes comprising up to N regular code words $c_r(1), c_r(2), \ldots$ and up to M special code words $c_s(1), c_s(2), \ldots$ whose code word lengths are ordered and bounded according to the two relations $$1 \leq l_r(1) \leq l_r(2) \leq \ldots \leq l_{max},$$

$$1 \leq l_s(1) \leq l_s(2) \leq \ldots \leq l_{max},$$

where $l_{max}$ is a chosen integer greater than or equal to $\log_2(N+M)$, the apparatus comprising:
- table storage for tables whose values can be adjusted to correspond to any ordinary or extended run-length code to be implemented;
- select/combine circuitry for accepting a binary event designation value, for selecting corresponding table values, and for combining these table values with the event designation value to calculate a code word; and
- shift-out circuitry for serially outputting the successive code word bits.

2. An apparatus according to claim 1, wherein the table storage holds a BR table, and BS table, a TR table, and a TS table whose elements are related to the code word lengths for the code to be implemented by the formulas:

$b_r(k) = $ number of regular code words with length $k$ or less;

$b_s(k) = $ number of special code words with length $k$ or less;

$$t_r(k) = \sum_{i=1}^{b_r(k)} 2^{k-1_r(i)} + \sum_{j=1}^{b_s(k-1)} 2^{k-1_s(j)} ;$$

$$t_s(k) = \sum_{i=1}^{b_r(k)} 2^{k-1_r(i)} + \sum_{j=1}^{b_s(k)} 2^{k-1_s(j)} .$$

3. An apparatus according to claim 2, wherein the select/combine circuitry comprises:
- means for accepting a binary event designation value comprising a one-bit integer $s$ and a multibit integer $i$, with the value $s=0$ indicating that the $i$th regular code word $c_r(i)$ is to be generated, and with the value $s=1$ indicating that the $i$th special code word $c_s(i)$ is to be generated;
- means for comparing $i$ with successive elements of the BR table until a table value $b_r(k)$ is found to satisfy $b_r(k) \geq i$, if $s=0$, or for comparing $i$ with successive elements of the BS table until a table value $b_s(k)$ is found to satisfy $b_s(k) \geq i$, if $s=1$;
- means for selecting a corresponding element $t_r(k)$ from the TR table if $s=0$, or for selecting a corresponding element $t_s(k)$ from the TS table, if $s=1$; and
- means for combining $i$ with the selected table elements to calculate the $l_{max}$-bit binary integer $$C = \begin{cases} 2^{l_{max}-k}[t_r(k) - b_r(k) + i-1] ; \text{ if } s=0 , \\ 2^{l_{max}-k}[t_s(k) - b_s(k) + i-1] , \text{ if } s=1 , \end{cases}$$

whose leftmost $k$ bits comprise the desired regular code word $c_r(i) = t_r(k) - b_r(k) + i-1$, if $s=0$, or the desired special code word $c_s(i) = t_s(k) - b_s(k) + i-1$, if $s=1$.

4. An apparatus according to claim 3 wherein the shift-out circuitry serially outputs the $k$ leftmost bits of the $l_{max}$-bit integer C calculated by the shift-out circuitry.

* * * * *